United States Patent [19]
Tsai et al.

[11] Patent Number: 6,083,815
[45] Date of Patent: Jul. 4, 2000

[54] METHOD OF GATE ETCHING WITH THIN GATE OXIDE

[75] Inventors: Chia-Shiung Tsai; Shu-Chih Yang, both of Hsin-Chu; Chao-Chey Chen, Matou, all of Taiwan

[73] Assignee: Taiwan Semiconductor Manufacturing Company, Hsin-Chu, Taiwan

[21] Appl. No.: 09/067,263

[22] Filed: Apr. 27, 1998

[51] Int. Cl.$^7$ .................... H01L 21/3205; H01L 21/4763
[52] U.S. Cl. .................. 438/585; 438/706; 438/714; 156/643
[58] Field of Search ................... 438/585, 706, 438/714

[56] References Cited

U.S. PATENT DOCUMENTS

| | | |
|---|---|---|
| 4,490,209 | 12/1984 | Hartman . |
| 4,502,915 | 3/1985 | Carter et al. . |
| 5,007,982 | 4/1991 | Tsou . |
| 5,013,398 | 5/1991 | Long et al. .............................. 156/643 |
| 5,030,590 | 7/1991 | Amani et al. . |
| 5,094,712 | 3/1992 | Becker et al. .......................... 156/643 |
| 5,201,993 | 4/1993 | Langley .................................. 156/643 |
| 5,223,085 | 6/1993 | Kawai et al. . |
| 5,242,536 | 9/1993 | Schoenborn . |
| 5,296,095 | 3/1994 | Nabexhima et al. . |
| 5,314,573 | 5/1994 | Higuchi et al. . |
| 5,453,156 | 9/1995 | Cher et al. . |
| 5,880,033 | 3/1999 | Tsai . |
| 5,900,163 | 5/1999 | Yi et al. . |

OTHER PUBLICATIONS

Frystak et al "Control of interfacial oxide using a novel cluster tool technology," IEEE /SEMI Advanced Semiconductor Manufactureing Conference ppg 28–33, 1994.

Verhaverbeke et al, "A high–selectively native oxide removal process for native oxide free processes," IEEE/ IEDM ppg 25.6.1–25.6.4, 1992.

Hoekstra et al, "Microtrenching resulting from specular reflection during chlorine etching of silicon," J. Vac. Sci. Technolog. B 16(4) ppg 2102–2104, Jul. 1998.

Dalton et al, "Microtrench formation in polysilicon plasma etching over thin gate oxide," J. Electrochem. Soc. vol. 140, No. 8, ppg 2395–2401, Aug. 1993.

Wu et al, "Breakdown yield and lifetime of thin gate oxides in CMOS processing," J. Electrocem. Soc., vol. 136, No. 6 ppg 1638–1645, Jun. 1989.

Wolf Silicon Processing for the VLSI Era vol. I ppg 520 and vol. III ppgs 461, 496, 511 and 514, 1986/1995.

*Primary Examiner*—John F. Niebling
*Assistant Examiner*—Jonathan Hack
*Attorney, Agent, or Firm*—George O. Saile; Stephen B. Ackerman

[57] ABSTRACT

A method for etching polysilicon or polycide gate electrodes over thin gate oxides is described wherein the problem of pitting and trenching of the silicon beneath the gate oxide, caused by penetration of the polysilicon etchant through the gate oxide is resolved. A cause of gate oxide penetration is found to be a native oxide formed on the exposed surface of polycide or polysilicon gate layer. The native oxide is uneven and has local thin spots which are penetrated by the traditional polysilicon etchants. The erratic penetration of the native oxide produces an uneven etch front which propagates down to the gate oxide. Gate oxides thinner than about 125 Å are incapable of absorbing this irregularity during polysilicon over etch and are penetrated causing deep pockets in the subjacent silicon. The novel method first etches the native oxide with a brief highly selective fluorocarbon etch and then etches through the polycide or polysilicon with C.2 and HBr to endpoint on the thin gate oxide. A final brief over etch period using a highly selective polysilicon to completes removal of polysilicon patches with negligible gate oxide consumption. By this method gate oxides as thin as 30 Å can successfully resist etchant penetration.

20 Claims, 6 Drawing Sheets

METHOD OF GATE ETCHING WITH THIN GATE OXIDE

BACKGROUND OF THE INVENTION (1) Field of the Invention

The invention relate s to processes for the manufacture of semiconductor devices and more particularly to processes for forming self-aligned polysilicon gate field effect transistors.

(2) Description of Prior Art and Background to the Invention

Complimentary metal oxide semiconductor(CMOS) field effect transistor(FET) technology involves the formation n-channel FETs(NMOS) and p-channel FETs(PMOS) in combination to form low current, high performance integrated circuits. The complimentary use of NMOS and PMOS devices, typically in the form of a basic inverter device, allows a considerable increase of circuit density of circuit elements by reduction of heat generation. The increase in device density accompanied by the shrinkage of device size has resulted in improved circuit performance and reliability as well as reduced cost. For these reasons CMOS integrated circuits have found widespread use, particularly in digital applications.

Figure 1:
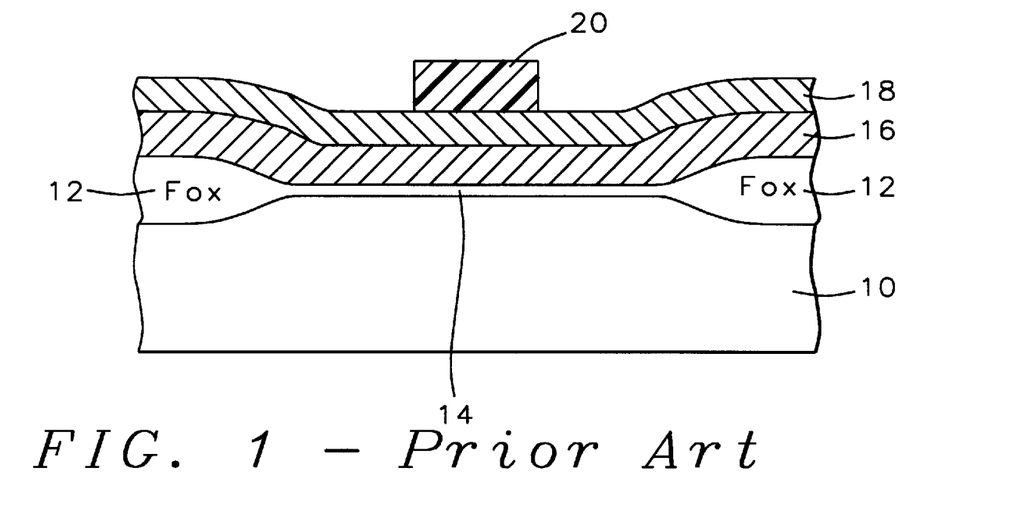
FIG. 1 through FIG. 3 are cross sections illustrating processing steps for the formation a of a polysilicon gate for a self-aligned polysilicon gate MOSFET according to a prior art technology.

The basic MOSFET, whether it be NMOS or PMOS is typically formed by a self-aligned polysilicon gate process. Referring to FIG. 1, there is shown a cross section of a wafer 10 illustrating the formation of an n-channel MOSFET. Field oxide isolation(FOX) regions 12 are formed on a p-type silicon wafer 10 by the well known process of local oxidation of silicon(LOCOS).

A gate oxide 14 is grown in the exposed silicon regions and a polysilicon layer 16 is deposited over it by low pressure chemical vapor deposition(LPCVD). The polysilicon layer 16 is typically undoped. A second conductive layer 18 comprising a transition metal silicide, for example $WSi_x$, is deposited over the polysilicon layer 16. The term polycide is commonly used to denote the silicide over polysilicon combination. The polysilicon layer 16 may itself be comprised of a lower undoped region and an upper doped region to make it more conductive. The second conductive layer 18 is applied to increase the conductivity of the gate electrode which will subsequently be formed. A photoresist layer 20 is deposited over the second layer 18 and patterned by photolithography to define a gate electrode which is then formed by etching the second conductive layer 18 and the polysilicon layer 16 by an anisotropic plasma etching technique, for example reactive ion etching (RIE).

Figure 2:
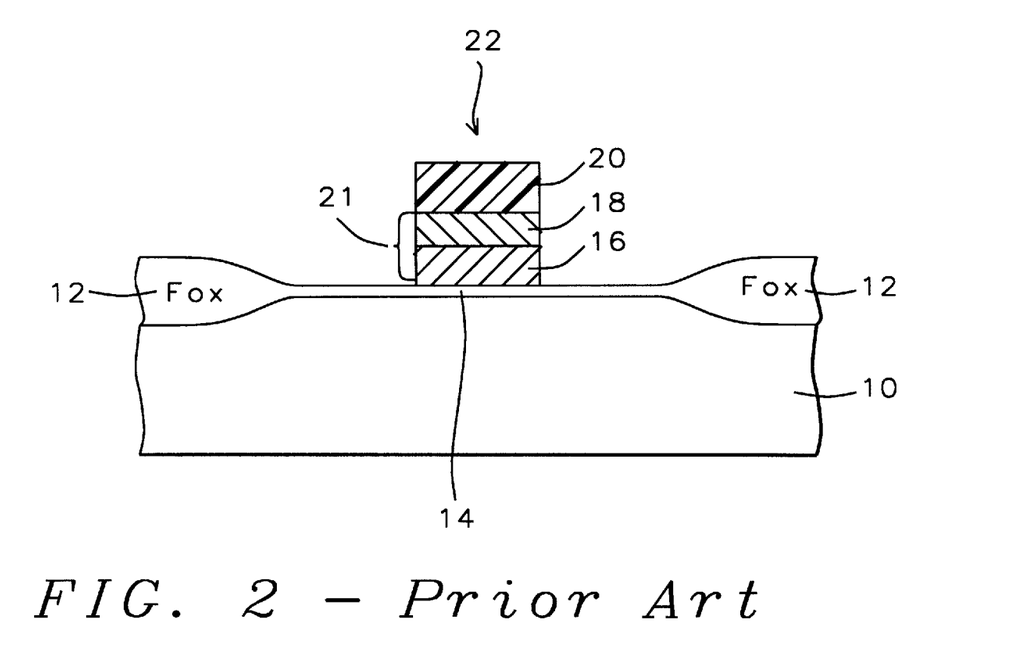

Referring to FIG. 2, the layers are etched down to the gate oxide 14, thereby forming the gate electrode 22. The sequence of layers which form the gate electrode are referred to as the gate stack 21. The etchants used are selected to provide a high polysilicon-to-silicon oxide selectivity so that the gate oxide layer functions as an etch stop and further permits an over etch period wherein residual pockets of polysilicon are removed.

Figure 3:
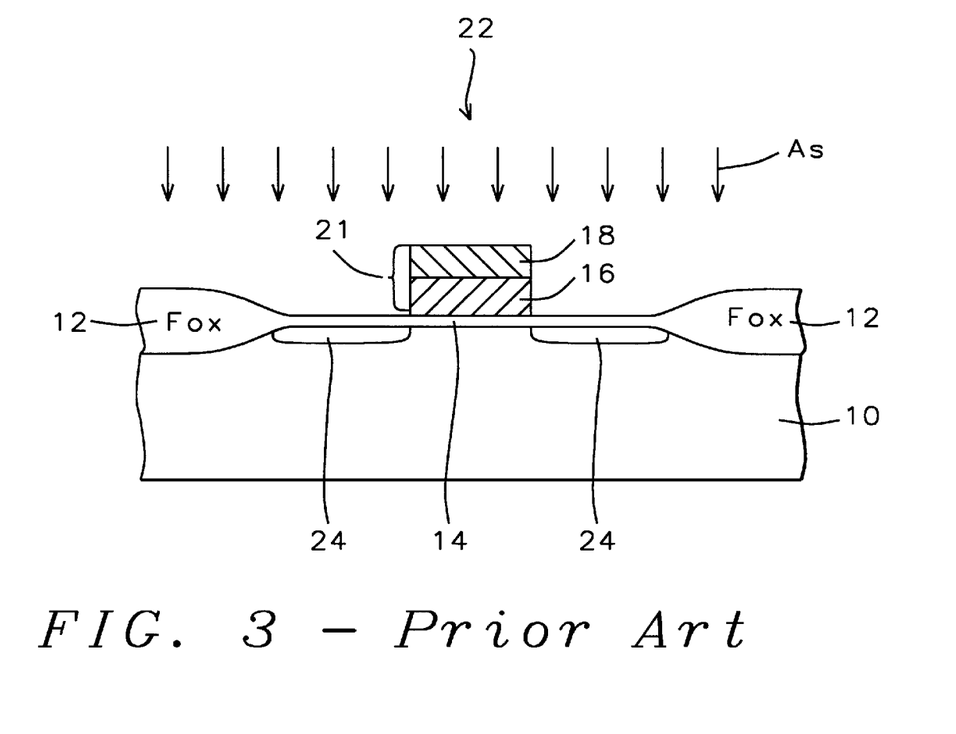

Referring now to FIG. 3, the residual photoresist 20 is stripped and lightly doped drain (LDD) regions 24 are formed by ion implantation of a dopant species, for example arsenic. The LDD implantation step is shown in the cross section of FIG. 3. The regions 24 are self-aligned to the polysilicon gate.

Anisotropic etching of the two layer gate stack 21 is conventionally accomplished by RIE or anisotropic plasma etching using etchants containing chlorine, for example $Cl_2$, or $CCl_4$. The etching of the two layers is performed in a single operation in an RIE reactor by first etching upper layer 18 with a first combination of reactants and conditions and then etching the lower layer 16 with a second combination. The lower polysilicon layer 16 is sometimes etched in two steps, the first, having a low polysilicon/oxide selectivity for removing the bulk of the layer and the second having a high polysilicon/oxide selectivity in order to avoid excessive penetration of the thin underlying gate oxide. A high selectivity also permits an over-etch period which is necessary to assure the removal of any residual pockets of polysilicon.

The balance between the thorough removal of polysilicon in the exposed regions and the avoidance of gate oxide penetration becomes increasingly delicate as the gate oxide becomes thinner. The probability of local penetration often caused by thin spots or other defects in the gate stack increases rapidly as gate oxide thicknesses fall below about 125 Å. Once local penetration is achieved, the underlying single crystalline silicon is rapidly attacked and becomes deeply pitted by the silicon etchant. The high selectivity of the final etch step now becomes a liability instead of an asset.

Figure 4:
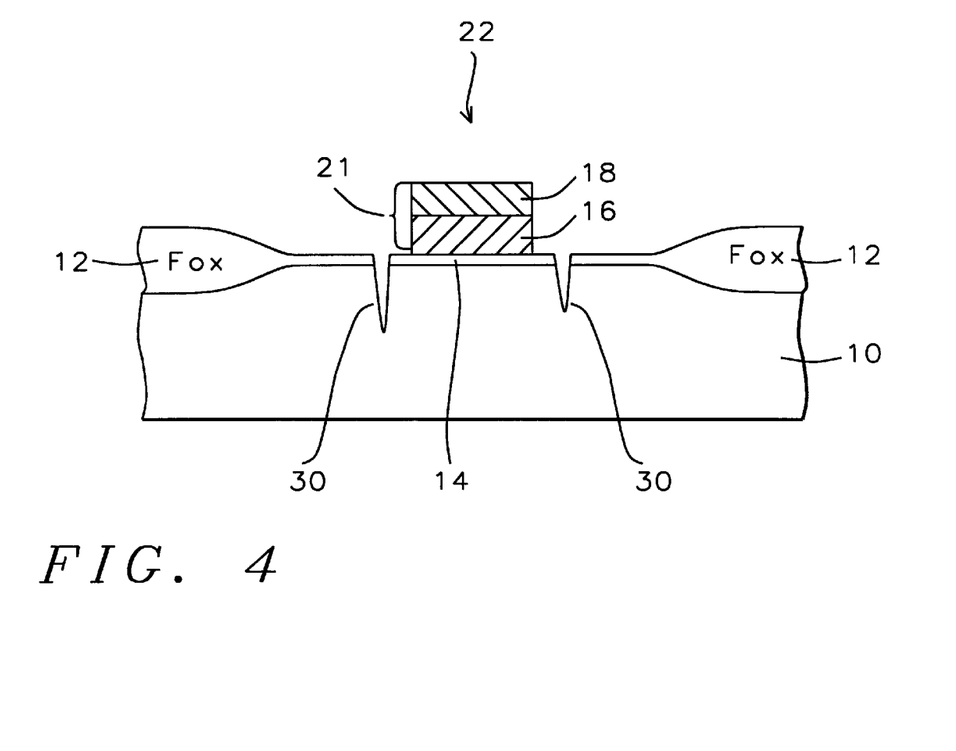
FIG. 4 is a cross section showing deep pits in the substrate silicon near a polysilicon gate electrode caused by etchant penetration of a thin gate oxide during the etching of the gate electrode.
Figure 5:
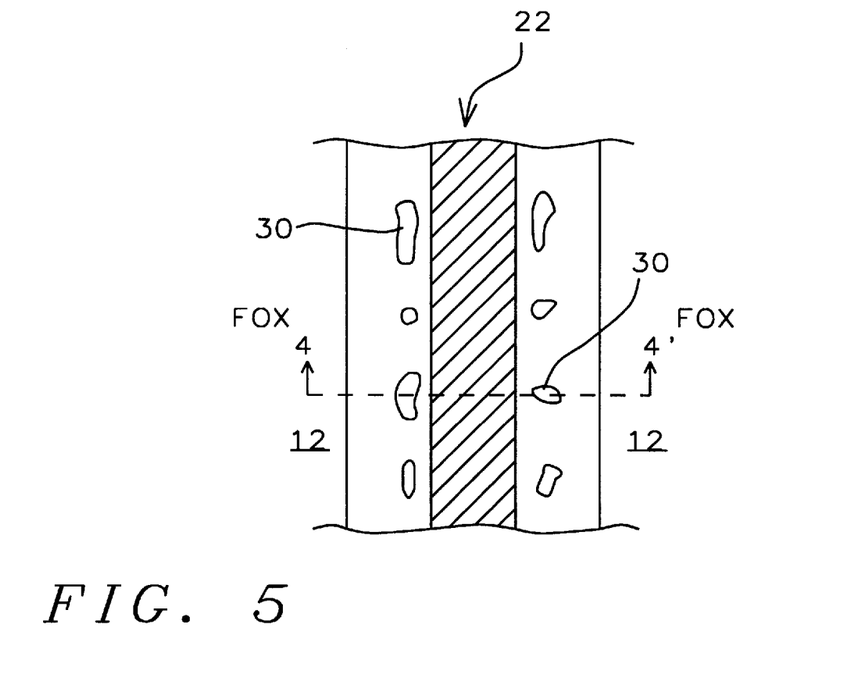
FIG. 5 is a plan view of silicon pits and trenches in the substrate silicon near a polysilicon gate electrode caused by etchant penetration of a thin gate oxide during the etching of the gate electrode.

FIG. 4 is a cross section of a gate stack after etching showing deep pits or trenches 30 in the silicon where the polysilicon etchant has penetrated the thin gate oxide layer and etched the underlying silicon. The pits 30 occur mostly near the edge of the gate stack but are found in other regions as well. FIG. 5 is a plan view showing the typical location and shape of the pits adjacent to the gate electrode 22. The cross section of FIG. 4 is represented by the line 4—4'. The severity of the pitting can be related to the amount of polysilicon over etch. However, if the over etch period is reduced to abate the pitting, isolated pockets of polysilicon remain. This dilemma is resolved by the current invention by eliminating a major cause of the development of thin spots in the gate stack.

The current invention teaches that the ultimate cause of the pitting of the silicon is a native oxide layer which forms on the surface of the uppermost layer 18 prior to etching. In etching the gate stack, the polysilicon etchant must first break through the native oxide layer in order to attack the polycide layer 18. Because the native oxide is very thin and highly resistive to the polysilicon etchant, the breakthrough is uneven and occurs first in isolated spots forming pits which are then propagated down through the silicide and polysilicon layers to the gate oxide. Gate oxides less than 125 Å thick are incapable of absorbing these irregularities and are consequently penetrated by the polysilicon etch.

Figure 6:
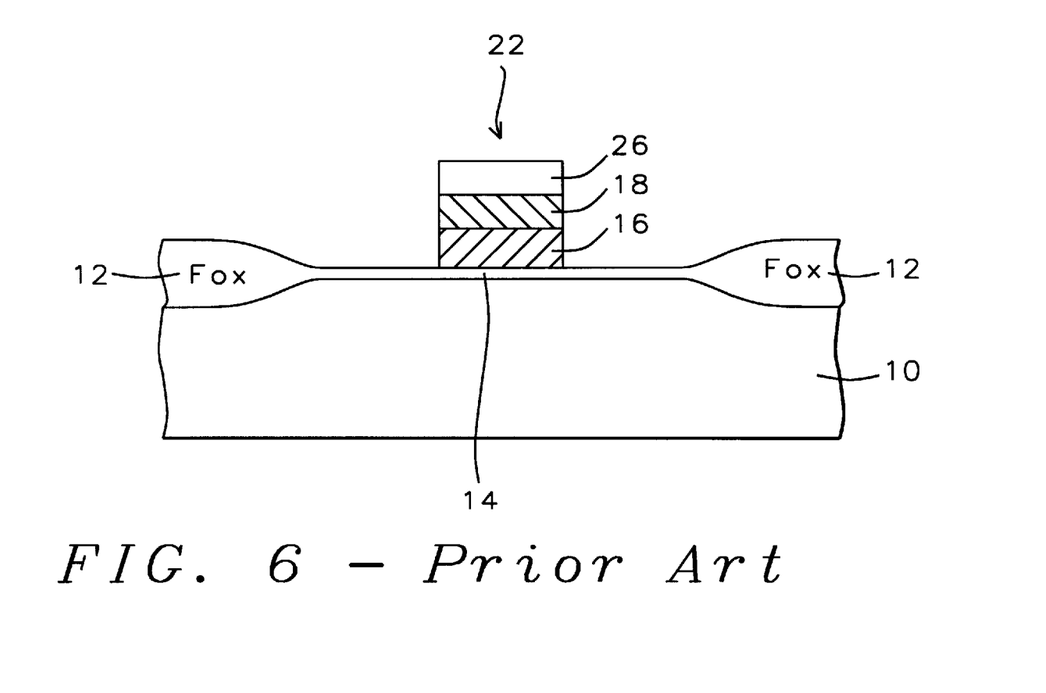
FIG. 6 is a cross section of a gate electrode stack having two conductive layers and an upper insulative layer.

In a frequently used variation of gate electrode formation, a three layer gate stack is employed. A cross section of such a gate stack is shown in FIG. 6. The third layer 26 is formed of an insulative material, for example silicon oxide. The insulator 26 prevents shorting of subsequently formed contact metallurgy to the gate electrode. The three layer gate stack is of particular benefit in the formation of self-aligned contacts.

A conventional method for etching the three layer gate stack involves the use of two separate RIE reactors. The oxide layer 26 is etched in a first RIE reactor which is dedicated to oxide etching. The wafer is then transferred to a second reactor configured for silicon etching wherein the polycide layers are etched. This practice is often convenient and practical because the configuration of oxide etching tools and silicon etching tools require different cathode materials for optimum etch rate selectivities.

In a variation of the three stack process, the oxide layer 26 is used as a hardmask for etching the subjacent polycide gate stack and is first patterned by photoresist. The photoresist is then stripped and the polycide gate stack is etched. In yet another variation the oxide layer 26 may be applied thinner (0.1 to 0.2 microns) than that in the conventional three layer stack, used only as a hardmask, and removed after the gate stack silicon etch.

Because the suicide layer 18 is exposed to atmosphere during the transfer from the oxide etching reactor to the silicon etching reactor, a native oxide is formed on the exposed polycide. Consequently, the problem of pitting or trenching of the underlying silicon caused by the penetration of thin gate oxides (<125 Å) is also observed in a three layer gate stack formed by the two reactor process.

Efforts to combine the silicon etching and oxide etching into a one tool single pumpdown operation for etching of the three layer gate stack have been proposed. This significantly reduces the chance of native oxide formation on the polysilicon after the oxide has been removed. However, these methods have other drawbacks which make them unsuitable for use in etching gate stacks with ultra thin gate oxides.

Long, et.al., U.S. Pat. No. 5,013,398 provides a method wherein both the oxide and polycide etches are accomplished in a single tool with a single non-erodible cathode. The oxide etch, which normally prefers an erodible electrode, is done in two stages with $SF_6$ and $CHF_3$ in a helium carrier gas. $SF_6$, typically a silicon etchant is added in small quantity and in critical measure to the $CHF_3$.

The convenience of single tool etching process invariably has it's trade-offs. Because a non-erodible cathode is used, it is difficult to achieve the high oxide/polysilicon selectivities affordable in a dedicated oxide etcher with an erodible cathode. In addition, it is difficult to time the endpoint of the oxide etch with sufficient accuracy and the over etch period required to clear all the oxide is longer than the period that would be required to etch a native oxide only. This leads to penetration of regions of polysilicon where the oxide clears early during the oxide overetch step. Thickness variations in the oxide are therefore translated into the polysilicon, whereas under high selectivity conditions, they would be eliminated. These irregularities are then added to any polysilicon thickness irregularities thereby extending the amount of polysilicon overetch necessary to completely clear the subjacent gate oxide. Clearly, extending the polysilicon overetch period over ultra thin gate oxides is not a favorable approach.

Becker, et. al., U.S. Pat. No. 5,094,712 cites the use of a magnetically enhanced RIE etcher used in a plasma etch mode. The oxide etch is $CF_4/CHF_3$ and a selectivity of oxide to $WS_{ix}$ of about 7.5:1 is cited. Langley, U.S. Pat. No. 5,201,993 reports high pressure (2–4 Torr) etching of the oxide layer in a single electrode system using $C_2F_6$ which provides more CFx etchant species and fewer fluorine radicals, resulting in an improved oxide/silicon selectivity. However, drawbacks of the high pressure method include photoresist damage and increased sidewall etching.

SUMMARY OF THE INVENTION

It is an object of this invention to provide a method for etching a polysilicon or polycide gate stack formed over gate oxides less than 125 Å thick.

It is another object of this invention to provide a method for eliminating the formation of pits and trenches in subjacent silicon conventional incurred by the etching of a gate stack over thin gate oxides.

It is yet another object of this invention to provide a method for etching a polysilicon or polycide gate stack formed over gate oxides less than 125 Å thick, permitting an adequate over etch period to assure the removal of remnant pockets of gate material without etchant penetration of the gate oxides.

These objects are accomplished by etching the polysilicon or polycide portions of the gate stack in a single plasma reactor configured for silicon etching and preceding the silicon etching by a brief highly selective oxide etch to remove native oxide which is formed over the surface of the exposed polysilicon or polycide. Thicker oxide layers such as those required by the three layer gate stack are separately etched in plasma tools configured and dedicated to oxide etching.

A thin native oxide is readily formed over polysilicon and silicide layers upon exposure to atmosphere. The native oxide is highly resistive to the silicon etchants used in etching of the gate stack. It is formed by surface reaction and it's thickness is non-uniform and dependent surface activity and topology.

According to the concepts of this invention, the thinner regions of the native oxide are penetrated first by the silicon etchants causing the formation of an irregular etching front with spikes in the subjacent polysilicon or silicide. The deeper regions initially pierced by the silicon etchants are propagated with the etching front down to the gate oxide where they penetrate the thin oxide during the over etch period causing pits in the single crystal silicon. By removing the native oxide layer before subjecting the wafer to the silicon etchants, the etching front is uniformly established and gate oxide penetration does not occur during the over etch period.

An initial brief oxide etch of 10 seconds or less suffices to remove the native oxide. Then, by using a highly selective etchant composition and conditions during the over etch period as described by this invention, gate oxides as thin as 30 Å can successfully resist etchant penetration.

The current invention teaches that local penetration of a native oxide present on the surface of the upper layer causes local thin spots which propagate through the entire etching sequence, culminating in the local penetration of the gate oxide and the formation of trenches in the subjacent silicon. Gate oxides thicker than about 125 Å are capable of accommodating these thin spots without manifesting penetration. However, gate oxides thinner than about 125 Å must not only have the native oxide removed prior to the silicon etch but the etchant composition and conditions during the over etch period must be made highly selective. To achieve the later objective, an etchant composition containing HBr and $Cl_2$ is used to etch the polysilicon to endpoint. This is followed by an over etch period with an etchant composition of HBr, He, and $O_2$.

DESCRIPTION OF THE PREFERRED EMBODIMENTS

Figure 7:
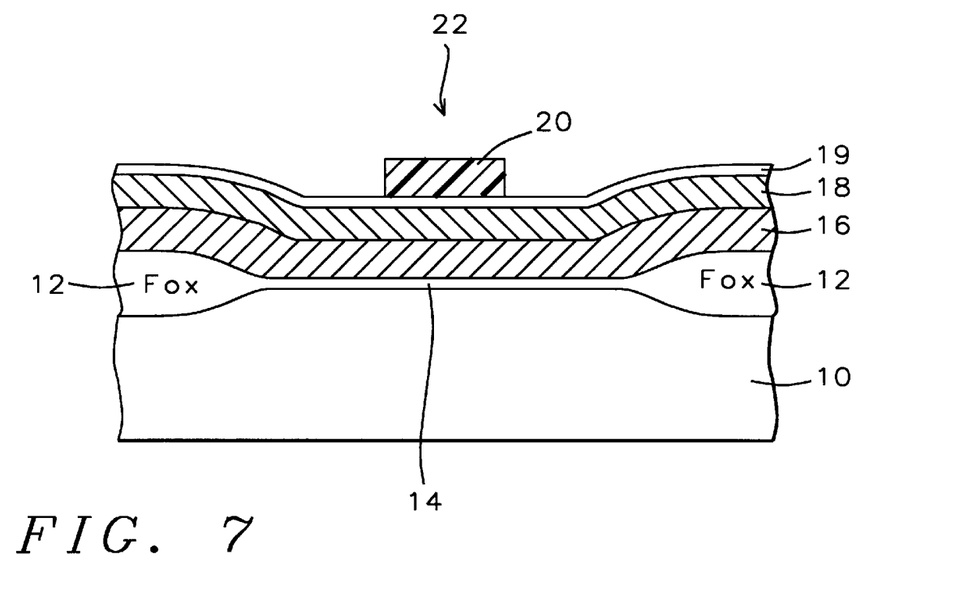
FIG. 7 and FIG. 8 are cross sections showing process steps in the formation of a self-aligned gate MOSFET with a two conductive layer gate electrode illustrating the teaching of this invention.

In a preferred embodiment of this invention a p-type monocrystalline silicon wafer is provided. The first embodiment addresses the formation of a two layer gate stack. Referring to FIG. 7, Field oxide isolation regions(FOX) 12 are formed over the wafer 10 using the well known LOCOS method. A thin gate oxide 14 is grown by thermal oxidation of the silicon wafer 10 in dry oxygen. The thickness of the oxide in this embodiment is between about 30 and 125 Å although thicker gate oxides may be used as well. Self aligned gate n-channel MOSFETs are to be formed having gate electrodes consisting of a first layer of polysilicon and a second layer of tungsten silicide($WSi_x$). A layer of undoped polysilicon 16 is deposited over the wafer by CVD methods well known by those practicing the art, for example by the pyrolysis of silane in hydrogen between 550° C.–650° C. A layer of tungsten silicide 18 is then deposited over the polysilicon layer 16 for example by the reaction of $WF_6$ and silane between about 350° C. and 450° C. The depositions may be done sequentially in the same furnace.

Alternatively the polysilicon layer 16 may be formed compositely having the first portion undoped and the final portion doped with, for example, arsenic or phosphorous. Alternatively the layer 18 may also be formed of another transition metal silicide, for example titanium silicide or tantalum silicide. Methods for the deposition of these various materials are well known and widely practiced.

The polysilicon layer 16 and the $WSi_x$ layer 18 form the conductive components of a gate electrode of a self-aligned polysilicon gate MOSFET. When the wafer 10 is removed from the LPCVD deposition furnace it is exposed to atmosphere and a thin native oxide film 19 is formed over the uppermost layer 18. The native oxide, is less than about 50 Å thick. Photoresist 20 is applied and patterned to define the gate electrode 22. The wafer is then placed into a high density plasma(HDP) parallel plate reactor. A suitable reactor is the model TCP-9400 manufactured by LAM Research Corporation. The reactor is fitted with a non erodible cathode, for example anodized aluminum or a silica plate bonded onto a metal cathode.

After evacuating the reactor to background pressure, a gas flow consisting of $CF_4$ at a flow rate of between about 20 and 50 SCCM (Standard $cm^3$/min), $CHF_3$ at a flow rate of between about 20 and 50 SCCM and $CH_3F$ at a flow rate of between about 20 and 50 SCCM in a helium carrier gas is begun. The carrier gas flow is adjusted to maintain a pressure of between about 4 and 20 m Torr in the reactor chamber. An rf discharge is struck and maintained for a period of about 10 seconds. During this period the exposed native oxide layer is completely removed with minimal attack of the subjacent $WSi_x$ layer 18. Alternatively $CH_2F_2$ may be substituted for the $CH_3F$. Table I lists the etch rates and oxide/doped polysilicon selectivities of several fluorocarbon combinations. The selectivity of $Cl_2$ is also included for reference.

Also indicated in Table I is the degree of occurrence of silicon trenching for selected process times when various etchants are used to break through the native oxide layer over a polysilicon/gate oxide stack. Clearly, when $Cl_2$ alone is used to penetrate the native oxide and thereafter etching the polysilicon, the uneven oxide break through, aggravated by the poor selectivity, causes irregular gouging of the subjacent polysilicon thereby creating an uneven etch front which is thereafter propagated to the thin gate oxide. The table also shows that a longer overetch period, required to properly remove the polysilicon residues, causes a worsening of the trenching problem.

In the current embodiment the initial native oxide 19 formed on the $WSi_x$ layer 18 is removed by an oxide etch performed under conditions producing a high oxide selectivity thereby exposing the WSiX surface evenly and with negligible penetration. During subsequent $WSi_x$ etching the etch front initiates evenly at the $WSi_x$ surface and propagates evenly through the subjacent polysilicon layer 16 to the gate oxide 14.

TABLE I

| | Etch Rates and Selectivities of various etchants used to break through native oxide over polysilicon: | | | Process Window: | | |
|---|---|---|---|---|---|---|
| Etchant | Oxide/Poly Selectivity | Oxide Etch Rate (Å/min) | Poly Etch Rate (Å/min) | Time (sec) | Poly residue | Silicon trenching |
| $Cl_2$ | 0.16 | 500 | 3000 | 20 | no | severe |
| | | | | 10 | yes | slight |
| $C_2F_6$ | 1.5 | 1800 | 1200 | 10 | no | no |
| | | | | 20 | no | no |
| $CF_4/CHF_3$ | 20 | 3000 | 250 | 10 | no | no |
| $CF_4/CHF_3/CH_3F$ | 50 | 4600 | 92 | 10 | no | no |

The composition of the gas mixture is next changed to one consisting of $Cl_2$ at a flow rate of between about 80 and 100 SCCM and a a 70%He+30% $O_2$ mixture at a flow rate of between about 3 and 5 SCCM, The flow of the 70%He+30% $O_2$ mixture is adjusted to maintain a pressure of between about 4 and 10 mTorr in the reactor chamber. An rf discharge is applied and the $WSi_x$ layer is etched.

The etching tool provides the capability of controlling both the ion density(TCP) and the ion energy(BIAS) of the glow discharge. The $WSi_x$ layer 18 is etched at an rf discharge of 200 Watts TCP or thereabout and 100 Watts BIAS. The rf discharge is maintained until an endpoint is reached. The endpoint is determined by optical emission spectroscopy by the observation of the change of the $SiCl_x$ peak at 405 nm. This endpoint indicates that the polysilicon layer has been reached. A 30–50% over etch of the $WSi_x$ is allowed to assure it's over all removal.

The polysilicon layer is then etched with an etchant composition consisting of $Cl_2$ at a flow rate of between about 70 and 90 SCCM, HBr at a flow rate of between about 110 and 130 SCCM in a carrier gas of helium. The flow rate of the carrier gas is adjusted to maintain a pressure of between about 8 and 12 mTorr in the reactor chamber.

An rf discharge having a power of about 250 Watts TCP and about 200 Watts BIAS is struck and maintained until an endpoint is reached. The endpoint is determined by optical emission spectroscopy by observing the decline of a silicon peak at 405 nm. This occurrence signals the appearance of patches of exposed gate oxide and the onset of clearing the surface of polysilicon.

In order to minimize the loss of gate oxide 14, the etchant composition is now altered to further increase the selectivity of polysilicon over oxide in an over etch period. The over etch removes all vestiges of exposed polysilicon and is performed as a timed etch in an etchant composition consisting of HBr at a flow rate of between about 180 and 220 SCCM, a 70%He+30% $O_2$ mixture at a flow rate of between about 2 and 4 SCCM in a helium carrier gas. The flow of the carrier gas is adjusted to maintain a pressure of between about 55 and 65 mTorr in the reactor chamber. An rf power of about 230 Watts TCP and about 180 Watts BIAS is applied and maintained for an over etch time period of between about 20 and 40 seconds.

Figure 8:
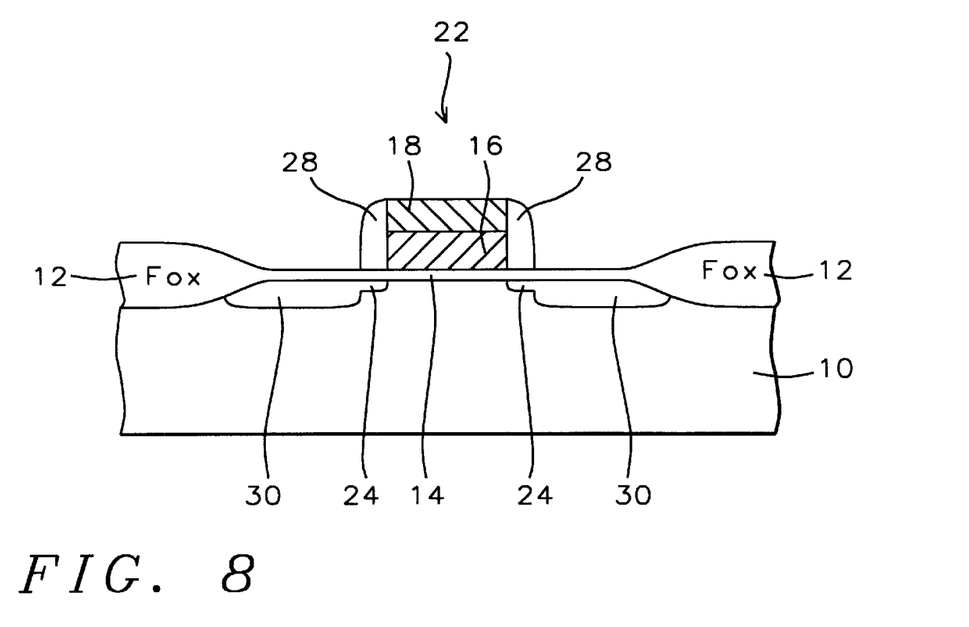

Referring now to FIG. 8, after the gate stack 22 has been etched, residual photoresist 20 is removed, preferably by ashing in oxygen, LDD regions 24 are ion implanted and sidewall structures 28 are formed by the well known method of blanket deposition of an oxide layer followed by anisotropic etching back to the silicon leaving the sidewall structures on the edges of the gate stack 22. The MOSFET is completed by a source/drain ion implant which forms the doped regions 30 to which contacts are later made by conventional methods through openings etched in an insulative layer deposited over the wafer.

In a second embodiment, referring back to FIG. 7, the first conductive layer 16 is formed of undoped polysilicon and the second conductive layer 18 is formed of polysilicon doped with an impurity ion for example phosphorous or arsenic to increase it's conductivity. As in the first embodiment, a native oxide layer 19 is formed by exposure to atmosphere prior to insertion into the plasma reactor which anisotropically etches the conductive layers. The processing steps for etching the gate stack are identical to those used in the first embodiment except that the $WSi_x$ etch step is eliminated. Instead both undoped polysilicon layer 16 and the doped polysilicon layer 18 are etched with the etchant composition and conditions given in the first embodiment for the undoped polysilicon layer 16.

In a third embodiment a three layer gate stack is formed. The configuration is illustrated by the cross section in FIG. 6. The insulative layer 26 in combination with subsequently formed insulative sidewall structures provide the electrical isolation between the gate electrode 16,18 and subsequently formed self-aligned contacts.

Figure 9:
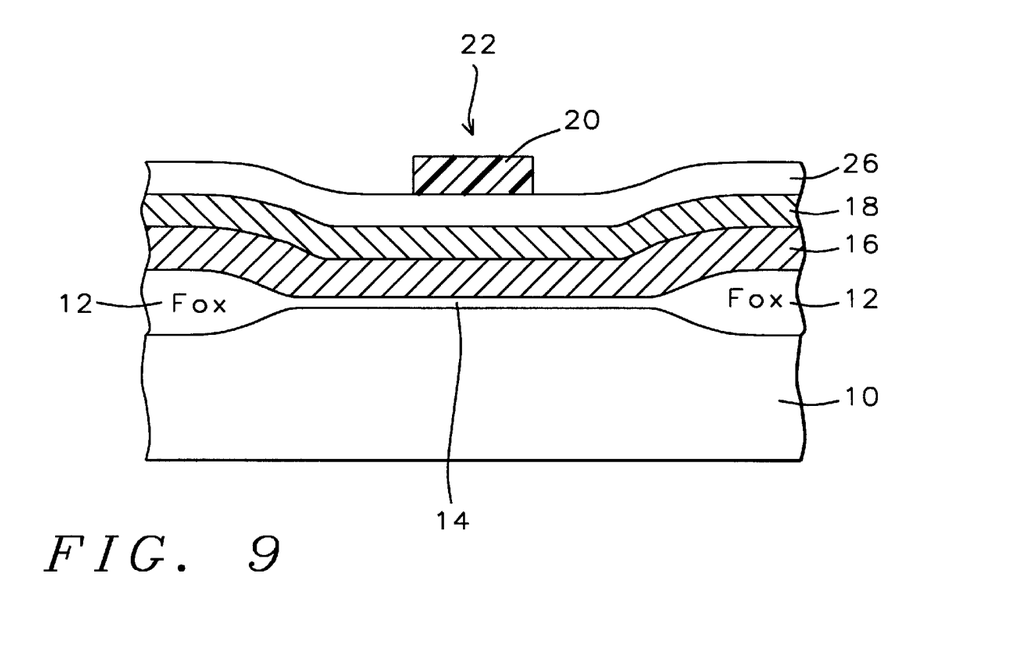
FIG. 9 through FIG. 11 are cross sections showing process steps in the formation of a self-aligned gate MOSFET with a gate electrode stack having two conductive layers and an upper insulative layer to illustrate the teaching of this invention.

Referring now to FIG. 9, a p-type silicon wafer 10 is provided. Field oxide isolation regions(FOX) 12 are formed over the wafer 10 using the well known LOCOS method. A thin gate oxide 14 is grown by thermal oxidation of the silicon wafer 10 in dry oxygen. The thickness of the oxide in this embodiment is between about 30 and 125 Å although thicker gate oxides may be used as well. Self aligned gate n-channel MOSFETs are to be formed having gate electrodes consisting of a first layer of polysilicon and a second layer of tungsten silicide($WSi_x$). A layer of undoped polysilicon 16 is deposited over the wafer by CVD methods well known by those practicing the art, for example by the pyrolysis of silane in hydrogen between 550° C.–650° C. A layer of tungsten silicide 18 is then deposited over the polysilicon layer 16 for example by the reaction of $WF_6$ and silane between about 350° C. and 450° C. The depositions may be done sequentially in the same furnace.

Alternatively the polysilicon layer 16 may be formed compositely having the first portion undoped and the final portion doped with, for example, arsenic or phosphorous. Alternatively the layer 18 may also be formed of another transition metal silicide, for example titanium silicide or tantalum silicide. Methods for the deposition of these various materials are well known and widely practiced.

The layers polysilicon layer 16 and the $WSi_x$ layer 18 form the conductive components of a gate electrode of a self-aligned polysilicon gate MOSFET. A layer of an insulative material 26, for example silicon oxide, is deposited over the $WSi_x$ layer 18 by conventional CVD methods, for example by the thermal decomposition of tetraethyl orthosilicate(TEOS). The insulative layer is deposited to a thickness of between about 1,000 and 5,000 Angstroms. Photoresist 20 is applied and patterned to define the gate electrode 22. The wafer is then placed into a conventional Plasma reactor configured to etch oxides. Such a reactor is typically of the parallel plate type having a cathode fitted with an erodible material, for example silicon or graphite. The oxide layer 26 is etched with an etchant composition containing fluorocarbons which has a high etch rate selectivity of insulative layer-to-silicon the endpoint may be timed or determined by optical emission spectroscopy.

Figure 10:
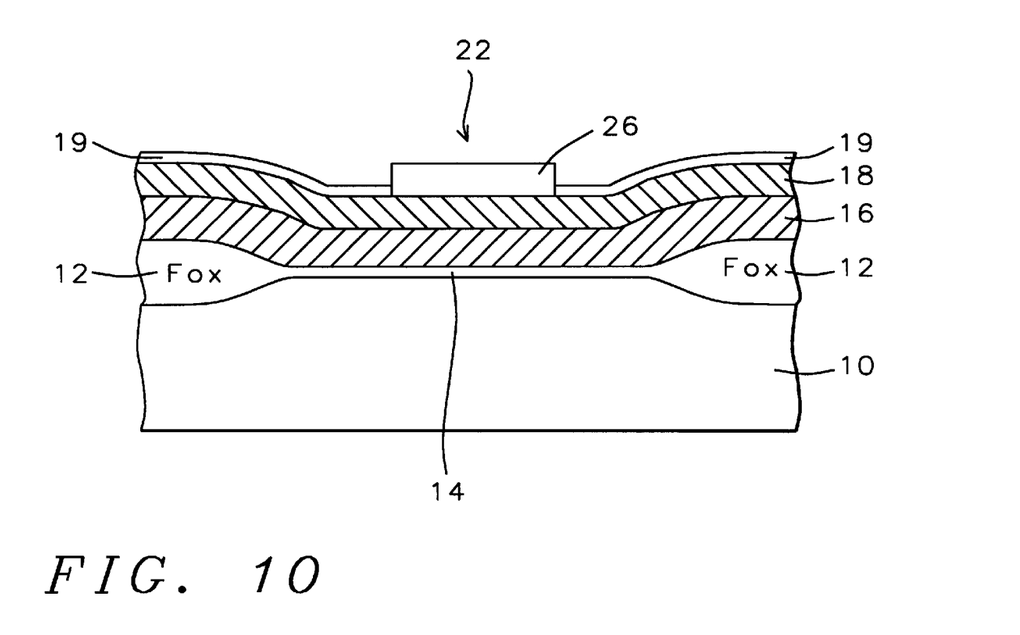

Referring to FIG. 10, the wafer 10 is then removed from the oxide reactor and the photoresist layer is stripped. During these operations the wafer 10 is exposed to atmosphere and a thin native oxide film 19 is formed over the exposed portion of the uppermost layer 18. The native oxide 19, is less than about 50 Å thick and is of uneven thickness. The wafer 10 is then placed into a high density plasma(HDP) parallel plate reactor. A suitable reactor is the model TCP-9400 manufactured by LAM Research Corporation. The reactor is fitted with a non-erodible cathode, for example anodized aluminum.

After evacuating the reactor to background pressure, a gas flow consisting of $CF_4$ at a flow rate of between about 20 and 50 SCCM, $CHF_3$ at a flow rate of between about 20 and 50 SCCM and $CH_3F$ at a flow rate of between about 20 and 50 SCCM in a helium carrier gas is begun. The carrier gas flow is adjusted to maintain a pressure of between about 4 and 20 mTorr in the reactor chamber. An rf discharge is struck and maintained for a period of about 10 seconds. During this period the exposed native oxide layer is completely removed with minimal attack of the subjacent $WSi_x$ layer 18 and negligible consumption of the insulative layer 26. Alternatively $CH_2F_2$ may be substituted for the $CH_3F$. Oxide/silicide etch rate selectivities between 20:1 and 50:1 are realized with these chemistries.

The composition of the gas mixture is next changed to one consisting of $Cl_2$ at a flow rate of between about 80 and 100 SCCM and a 70%He+30% $O_2$ mixture at a flow rate of between about 3 and 5 SCCM, The flow of the 70%He+30% $O_2$ mixture is adjusted to maintain a pressure of between about 4 and 10 mTorr in the reactor chamber. An rf discharge is applied and the $WSi_x$ layer is etched.

The etching tool provides the capability of controlling both the ion density(TCP) and the ion energy(BIAS) of the glow discharge. The WSi$_x$ layer 18 is etched at an rf discharge of 200 Watts TCP or thereabout and 100 Watts BIAS. The rf discharge is maintained until an endpoint is reached. The endpoint is determined by optical emission spectroscopy by the observation of the change of the SiCl$_x$ peak at 405 nm. This endpoint indicates that the polysilicon layer has been reached. A 30–50% over etch of the WSi$_x$ layer 18 is allowed to assure it's over all removal.

The polysilicon layer 16 is then etched with an etchant composition consisting of Cl$_2$ at a flow rate of between about 70 and 90 SCCM, HBr at a flow rate of between about 110 and 130 SCCM in a carrier gas of helium. The flow rate of the carrier gas is adjusted to maintain a pressure of between about 8 and 12 mTorr in the reactor chamber.

An rf discharge is having a power of about 250 Watts TCP and about 200 Watts BIAS is struck and maintained until an endpoint is reached. The endpoint is determined by optical emission spectroscopy by observing the decline of a silicon peak at 405 nm. This occurrence signals the appearance of patches of exposed gate oxide and the onset of clearing the surface of polysilicon.

In order to minimize the loss of the gate oxide 14, the etchant composition is now altered to further increase the selectivity of polysilicon over oxide in an over etch period. The over etch removes all vestiges of exposed polysilicon and is performed as a timed etch in an etchant composition consisting of HBr at a flow rate of between about 180 and 220 SCCM, a 70%He+30% O$_2$ mixture at a flow rate of between about 2 and 4 SCCM in a helium carrier gas. The flow of the carrier gas is adjusted to maintain a pressure of between about 55 and 65 mTorr in the reactor chamber. An rf power of about 230 Watts TCP and about 180 Watts BIAS is applied and maintained for an over etch time period of between about 20 and 40 seconds.

Figure 11:
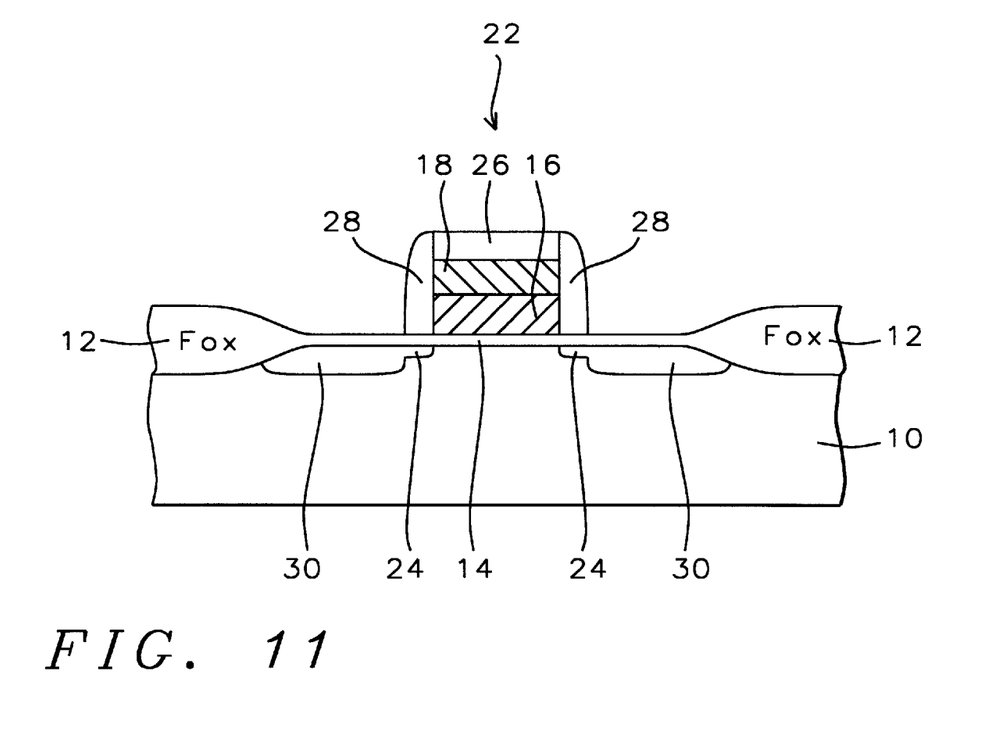

FIG. 11 shows a cross section of the wafer after the gate stack 22 has been etched. The thin gate oxide layer 18 is not pitted by the gate stack etch. The LDD regions 24 are next ion implanted and sidewall structures 28 are formed by the well known method of blanket deposition of an oxide layer followed by anisotropic etching back to the silicon leaving the sidewall structures on the edges of the gate stack 22. The MOSFET is completed by a source/drain ion implant which forms the doped regions 30 to which contacts are later made by conventional methods through openings etched in an insulative layer deposited over the wafer.

While this invention has been particularly shown and described with reference to the preferred embodiments thereof, it will be understood by those skilled in the art that various changes in form and details may be made without departing from the spirit and scope of the invention.

While the embodiments of this invention utilize a p-type silicon substrate, an n-type silicon substrate could also be used without departing from the concepts therein provided.

What is claimed is:

1. A method for forming a gate electrode of a self-aligned gate MOSFET comprising:
    (a) providing a silicon wafer having:
        (i) a gate oxide;
        (ii) a first conductive layer overlying said gate oxide;
        (iii) second conductive layer overlying said first conductive layer;
        (iv) a native oxide layer formed on said second conductive layer;
        (v) a photoresist layer overlying said wafer and patterned to define a gate electrode;
    (b) providing a parallel plate high density plasma etcher having an anode plate whereupon wafers are placed and a non-erodible cathode plate in an evacuable chamber;
    (c) placing said wafer on said anode plate and evacuating said chamber;
    (d) etching said native oxide layer in a first gas flow containing fluorocarbons;
    (e) etching said second conductive layer in a second gas flow containing Cl$_2$, He, and O$_2$ to a first endpoint and continuing beyond said first endpoint for a first time period of between about 30 to 50 percent of the time to reach said first endpoint;
    (f) etching said first conductive layer in a third gas flow containing Cl$_2$ and HBr to a second endpoint; and
    (g) etching said first conductive layer in a fourth gas flow containing HBr, He, and O$_2$ for a second time period past said second endpoint thereby forming a gate electrode.

2. The method of claim 1 wherein the thickness of said gate oxide is between about 30 and 200 Angstroms.

3. The method of claim 1 wherein said first conductive layer is polysilicon and said second conductive layer is selected from the group consisting of tungsten silicide, titanium silicide, and tantalum silicide.

4. The method of claim 1 wherein said native oxide is etched for a period no more than about 10 seconds.

5. The method of claim 1 wherein said first gas flow consists of CF$_4$ at a flow rate of between about 20 and 50 SCCM and CHF$_3$ at a flow rate of between about 20 and 50 SCCM in a helium carrier gas adjusted to maintain a pressure of between about 4 and 20 mTorr in said chamber.

6. The method of claim 1 wherein said first gas flow consists of CF$_4$ at a flow rate of between about 20 and 50 SCCM, CHF$_3$ at a flow rate of between about 20 and 50 SCCM and CH$_3$F at a flow rate of between about 20 and 50 SCCM in a helium carrier gas adjusted to maintain a pressure of between about 4 and 20 mTorr in said chamber.

7. The method of claim 1 wherein said first gas flow consists of CF$_4$ at a flow rate of between about 20 and 50 SCCM, CHF$_3$ at a flow rate of between about 20 and 50 SCCM and CH$_2$F$_2$ at a flow rate of between about 20 and 50 SCCM in a helium carrier gas adjusted to maintain a pressure of between about 4 and 20 mTorr in said chamber.

8. The method of claim 3 wherein said second gas flow consists of Cl$_2$ at a flow rate of between about 80 and 100 SCCM and a 70%He+30% O$_2$ mixture at a flow rate adjusted to maintain a pressure of between about 4 and 10 mTorr in said chamber.

9. The method of claim 3 wherein said third gas flow consists of Cl$_2$ at a flow rate of between about 70 and 90 SCCM, HBr at a flow rate of between about 110 and 130 SCCM in a carrier gas of helium adjusted to maintain a pressure of between about 8 and 12 mTorr in said chamber.

10. The method of claim 3 wherein said fourth gas flow consists of HBr at a flow rate of between about 180 and 220 SCCM, a 70%He+30% O$_2$ mixture at a flow rate of between about 2 and 4 SCCM in a carrier gas of He at a flow rate adjusted to maintain a pressure of between about 55 and 65 mTorr in the said chamber.

11. A method for forming a gate electrode stack comprising:
    (a) providing a silicon wafer having:
        (i) a gate oxide;
        (ii) a first conductive layer overlying said gate oxide;
        (iii) second conductive layer overlying said first conductive layer;
        (iv) an insulative layer overlying said second conductive layer;
        (v) a photoresist layer overlying said wafer and patterned to define a gate electrode stack;

(b) Anisotropically etching said insulative layer;

(c) exposing said wafer to atmosphere whereby a native oxide layer is formed on exposed portions of said second conductive layer;

(d) stripping said photoresist layer;

(e) providing a parallel plate high density plasma etcher having an anode plate whereupon wafers are placed and a non-erodible cathode plate in an evacuable chamber;

(f) placing said wafer on said anode plate and evacuating said chamber;

(g) etching said native oxide layer in a first gas flow containing fluorocarbons;

(h) etching said second conductive layer in a second gas flow containing $Cl_2$, He, and $O_2$ to a first endpoint and continuing beyond said first endpoint for a first time period of between about 30 to 50 percent of the time to reach said first endpoint;

(i) etching said first conductive layer in a third gas flow containing $Cl_2$ and HBr to a second endpoint; and (j) etching in a fourth gas flow containing HBr, He, and $O_2$ for a second time period past said second endpoint thereby forming a gate electrode stack.

12. The method of claim 11 wherein the thickness of said gate oxide is between about 30 and 200 Angstroms.

13. The method of claim 11 wherein said first conductive layer is polysilicon and said second conductive layer is selected from the group consisting of tungsten silicide, titanium silicide, and tantalum silicide.

14. The method of claim 11 wherein said native oxide is etched for a period of no more than about 10 seconds.

15. The method of claim 11 wherein said first gas flow consists of $CF_4$ at a flow rate of between about 20 and 50 SCCM and $CHF_3$ at a flow rate of between about 20 and 50 SCCM in a helium carrier gas adjusted to maintain a pressure of between about 4 and 20 mTorr in said chamber.

16. The method of claim 11 wherein said first gas flow consists of $CF_4$ at a flow rate of between about 20 and 50 SCCM, $CHF_3$ at a flow rate of between about 20 and 50 SCCM and $CH_3F$ at a flow rate of between about 20 and 50 SCCM in a helium carrier gas adjusted to maintain a pressure of between about 4 and 20 mTorr in said chamber.

17. The method of claim 11 wherein said first gas flow consists of $CF_4$ at a flow rate of between about 20 and 50 SCCM, $CHF_3$ at a flow rate of between about 20 and 50 SCCM and $CH_2F_2$ at a flow rate of between about 20 and 50 SCCM in a helium carrier gas adjusted to maintain a pressure of between about 4 and 20 mTorr in said chamber.

18. The method of claim 13 wherein said second gas flow consists of $Cl_2$ at a flow rate of between about 80 and 100 SCCM and a 70%He+30% $O_2$ mixture at a flow rate adjusted to maintain a pressure of between about 4 and 10 mTorr in said chamber.

19. The method of claim 13 wherein said third gas flow consists of $Cl_2$ at a flow rate of between about 70 and 90 SCCM, HBr at a flow rate of between about 110 and 130 SCCM in a carrier gas of helium adjusted to maintain a pressure of between about 8 and 12 mTorr in said chamber.

20. The method of claim 13 wherein said fourth gas flow consists of HBr at a flow rate of between about 180 and 220 SCCM, a 70%He+30% $O_2$ mixture at a flow rate of between about 2 and 4 SCCM in a carrier gas of He at a flow rate adjusted to maintain a pressure of between about 55 and 65 mTorr in the said chamber.

* * * * *